United States Patent
Kang et al.

(10) Patent No.: US 7,566,964 B2
(45) Date of Patent: Jul. 28, 2009

(54) ALUMINUM PAD POWER BUS AND SIGNAL ROUTING FOR INTEGRATED CIRCUIT DEVICES UTILIZING COPPER TECHNOLOGY INTERCONNECT STRUCTURES

(75) Inventors: Seung H. Kang, Macungie, PA (US); Roland P. Krebs, Allentown, PA (US); Kurt George Steiner, Fogelsville, PA (US); Michael C. Ayukawa, Zionsville, PA (US); Sailesh Mansinh Merchant, Breinigsville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/675,258

(22) Filed: Sep. 30, 2003

(65) Prior Publication Data

US 2004/0201101 A1    Oct. 14, 2004

Related U.S. Application Data

(60) Provisional application No. 60/462,504, filed on Apr. 10, 2003.

(51) Int. Cl.
*H01L 23/52* (2006.01)
(52) U.S. Cl. .............. 257/691; 257/668; 257/701; 257/750; 257/765; 257/E21.591
(58) Field of Classification Search ......... 257/750–752, 257/758–759, 760–762, 773, 668, 691, 701, 257/765
See application file for complete search history.

(56) References Cited

U.S. PATENT DOCUMENTS

| | | | |
|---|---|---|---|
| 4,060,828 A | 11/1977 | Satonaka | |
| 4,840,923 A | 6/1989 | Flagello et al. | |
| 5,148,263 A | 9/1992 | Hamai | |
| 5,436,412 A * | 7/1995 | Ahmad et al. | 174/265 |
| 5,719,448 A | 2/1998 | Ichikawa | |
| 6,018,187 A * | 1/2000 | Theil et al. | 257/458 |
| 6,107,185 A * | 8/2000 | Lukanc | 438/631 |
| 6,204,165 B1 | 3/2001 | Ghoshal | |
| 6,225,207 B1 | 5/2001 | Parikh | |
| 6,229,221 B1 * | 5/2001 | Kloen et al. | 257/784 |
| 6,232,662 B1 * | 5/2001 | Saran | 257/750 |
| 6,261,944 B1 | 7/2001 | Mehta et al. | |
| 6,331,482 B1 * | 12/2001 | Honeycutt et al. | 438/642 |
| 6,348,731 B1 * | 2/2002 | Ashley et al. | 257/751 |
| 6,348,732 B1 * | 2/2002 | Lopatin et al. | 257/751 |
| 6,376,353 B1 * | 4/2002 | Zhou et al. | 438/612 |
| 6,410,435 B1 * | 6/2002 | Ryan | 438/687 |
| 6,448,650 B1 * | 9/2002 | Saran et al. | 257/758 |
| 6,451,681 B1 * | 9/2002 | Greer | 438/601 |
| 6,455,943 B1 * | 9/2002 | Sheu et al. | 257/758 |
| 6,555,459 B1 * | 4/2003 | Tokushige et al. | 438/612 |
| 6,614,091 B1 * | 9/2003 | Downey et al. | 257/499 |
| 6,649,993 B2 * | 11/2003 | Theil | 257/458 |
| 6,713,381 B2 * | 3/2004 | Barr et al. | 438/622 |
| 6,717,270 B1 * | 4/2004 | Downey et al. | 257/758 |
| 6,740,985 B1 * | 5/2004 | Zhao | 257/784 |
| 6,798,073 B2 * | 9/2004 | Lin et al. | 257/778 |
| 6,930,379 B2 * | 8/2005 | Seshan | 257/691 |
| 6,979,896 B2 * | 12/2005 | Seshan | 257/691 |

(Continued)

*Primary Examiner*—Wai-Sing Louie

(57) ABSTRACT

An integrated circuit device structure and a process for fabricating the structure wherein the power bus interconnect structure is formed in the aluminum pad or contact layer. An interconnect structure for interconnecting underlying levels of interconnect can also be formed in the aluminum pad layer.

7 Claims, 9 Drawing Sheets

U.S. PATENT DOCUMENTS

2001/0036716 A1* 11/2001 Chittipeddi et al. ......... 438/584
2002/0038903 A1* 4/2002 Tsau ......................... 257/532
2002/0068441 A1 6/2002 Lin
2002/0109232 A1 8/2002 Lin et al.
2003/0218259 A1* 11/2003 Chesire et al. .............. 257/786

* cited by examiner

ALUMINUM PAD POWER BUS AND SIGNAL ROUTING FOR INTEGRATED CIRCUIT DEVICES UTILIZING COPPER TECHNOLOGY INTERCONNECT STRUCTURES

This patent application claims the benefit of the provisional patent application filed on Apr. 10, 2003, assigned application Ser. No. 60/462,504 and entitled Aluminum Pad Power Bus in a Copper Technology.

BACKGROUND OF THE INVENTION

Integrated circuits (or chips) typically comprise a silicon substrate and semiconductor devices, such as transistors, formed from doped regions within the substrate. Interconnect structures, formed in parallel-like layers overlying the semiconductor substrate, provide electrical connection between devices to form electrical circuits. Typically, several (e.g., 6-9) interconnect layers (each referred to as an "M" or metallization layer) are required to interconnect the devices in a typical integrated circuit. The top interconnect layer comprises a plurality of pads that serve as attachment points for conductive elements (e.g., bond wires or solder balls) for interconnecting the integrated circuit devices to off-chip external contacts, such as pins or leads of a package structure.

A conventional interconnect system comprises a plurality of substantially vertical conductive vias or plugs and substantially horizontal conductive interconnect layers, with a dielectric layer disposed between two vertically adjacent interconnect layers. Upper level conductive vias interconnect two vertically adjacent interconnect layers. Conductive vias in the first or lowest level interconnect an underlying semiconductor device region to an overlying interconnect layer. The interconnect structures are formed by employing conventional metal deposition, photolithographic masking, patterning and etching techniques.

As integrated circuit devices and interconnect structures shrink, and as the devices carry higher frequency analog signals and higher data rate digital signals, the interconnect structures can disadvantageously add delays to the signal propagation time. Also, the increasing complexity of the devices and the added functionality they provide may require a greater number of interconnect structures or levels. But the conventional interconnect metallization material, e.g., aluminum, severely limits signal speed. Also, the contact resistance between the aluminum interconnect structure and device silicon regions contributes significantly to the total circuit resistance, especially as the number of circuit devices and interconnect structures increases. Finally, as interconnect line widths shrink, it is increasingly difficult to deposit conductive material in openings or windows to form high aspect ratio (i.e., the ratio of the opening depth to the opening diameter) conductive vias.

Given the known disadvantages of aluminum interconnect structures, copper is becoming the interconnect material of choice. Copper is a better conductor than aluminum (with a resistance of 1.7 micro-ohm cm compared to 3.1 micro-ohm cm for aluminum), is less susceptible to electromigration (a phenomenon whereby the aluminum interconnect structure thins and can eventually separate due to the electric field and thermal gradients formed by current flow through the aluminum interconnect), can be deposited at lower temperatures (thereby avoiding deleterious effects on previously formed dopant profiles) and is suitable for use in high aspect ratio applications.

The damascene process is one technique for forming copper interconnect structures for integrated circuit devices. Typically, the copper damascene process integrally forms both the conductive vertical via portion and the conductive horizontal interconnect portion (referred to as a metal runner) of an interconnect or metallization layer. To form a copper damascene structure, a hole or window is formed in a dielectric layer, followed by formation of an overlying trench for the metal runner. A subsequent metal deposition step fills both the opening and the trench, forming a complete metal layer comprising a substantially vertical conductive via and a substantially horizontal conductive runner. A final chemical/mechanical polishing step planarizes the deposited metal with respect to the adjacent surface of the dielectric layer.

An example of a prior art dual damascene process is illustrated in the cross-sectional views of FIGS. 1A-1C during various stages of fabrication. As depicted in FIG. 1A, a dielectric layer 10 is deposited or formed on a lower level interconnect 12. A photoresist layer 16, formed over the dielectric layer 10, is patterned and etched according to conventional techniques to form an opening 18 therein. An anisotropic etch process etches a via hole or window 20 in the dielectric layer 10 through the opening 18. The photoresist layer 16 is removed and replaced by a photoresist layer 30 (see FIG. 1B) that is then patterned and etched to form a trench pattern 32. An anisotropic etch process forms a trench 34 (extending perpendicular to the plane of the paper) and simultaneously extends the opening 18 to an upper surface 36 of the lower level interconnect 12. The hole or window 20 can be formed to stop on the upper surface 36 and expose the lower level interconnect 12 (as shown in FIG. 1B) or alternatively can be over-etched to extend partially into the lower level interconnect 12.

As illustrated in FIG. 1C, the hole 20 and trench 34 are simultaneously filled with a suitable conductive material 40, such as copper. According to standard process techniques, a copper seed layer is first deposited, followed by copper electroplating to fill the hole 20 and the trench 34. The material 40 thus forms a conductive trench 42 and a conductive via 44 in contact with the lower level interconnect 12. Additionally, if the material 40 comprises copper, a barrier layer, such as a tantalum layer and/or a tantalum-nitride layer (or other refractory materials and their nitrides) is deposited in the hole 20 and the trench 34, prior to copper deposition. The barrier layer or layers prevents the diffusion of copper into the surrounding material of the dielectric layer 10. Finally, after deposition, the surface of the dielectric layer 10 is planarizes to remove excess metal 40 from a field region 48 using techniques, such as chemical/mechanical polishing (CMP), that are well known in the art.

A second example of prior art dual damascene structure for integrated circuit devices is shown in FIGS. 2A-2C As depicted in FIG. 2A, multiple material layers are formed on a lower level interconnect 58, including a first etch stop layer 60, a first dielectric layer 62, a second etch stop layer 64, a second dielectric layer 66, and an etch mask 68. The etch mask 68 is patterned and etched to form an opening 70 therein. Using the etch mask pattern, an anisotropic first etch process forms a via opening 72 in the second dielectric layer 66, extending downwardly through the second etch stop layer 64 to the first etch stop layer 60. The etch process is terminated when the etchant reaches the etch stop layer 60. The etch mask 68 is removed, an etch mask 78 (see FIG. 2B) is positioned over the second dielectric layer 66 and masked to form an opening 79, which is larger laterally than the opening 70. A second anisotropic etch process etches a trench 80 in the second dielectric layer 66. Simultaneously, the via opening 72 is extended downwardly by etching through the etch stop layer 60, to contact with the underlying lower level interconnect 58. According to this technique the first etchant has a greater selectivity to the etch stop layer 60 than the second etchant. To complete the damascene process, the mask 78 is removed and the trench 80 and via opening 72 are simultaneously filled with a suitable conductive metal (see FIG. 2C) forming a conductive runner 88 and a conductive via 90 in contact with the lower level interconnect 58. The excess conductive material is removed from a field region surface 92 of the second dielectric layer 66, using techniques such as CMP, as known in the art.

In addition to carrying signals between the semiconductor elements, the interconnect structure, whether fabricated from aluminum or copper, is also required to supply power to the various device elements through a power bus structure. In most integrated circuits the power bus is formed as an additional interconnect layer, including vertical conductive vias and a horizontal interconnect layer. Typically the power bus forms the top level interconnect structure. Disadvantageously, the additional power bus interconnect layer increases the number of mask steps, mask layers and process steps, all contributing to an increased fabrication cost. Further, these additional process steps can lower the device yield as they present opportunities for the occurrence of processing defects.

Since the power bus conducts a relatively high current, as compared with the signal interconnect structures, the power bus interconnect layer generally has a greater width, thickness and pitch than the signal interconnect layers. The power bus is also a source of noise and parasitic capacitance that can disrupt performance of proximate devices and interconnect structures. To limit these effects, the power bus may be isolated from other device structures, with the isolating structures consuming valuable device area.

BRIEF SUMMARY OF THE INVENTION

An integrated circuit device comprises a multilevel interconnect metallization system formed over a semiconductor substrate layer, wherein the metallization system includes a bond pad level and one or more levels of interconnect underlying the bond pad level. The bond pad level comprises a plurality of contact pads each configured for connection external to the device and an interconnect configured to transfer power from one or more of the pads to one or more of the underlying levels of interconnect.

BRIEF DESCRIPTION OF THE DRAWINGS

The present invention can be more easily understood and the advantages and uses thereof more readily apparent, when considered in view of the following detailed description when read in conjunction with the following figures wherein.

In accordance with common practice, the various described device features are not drawn to scale, but are drawn to emphasize specific features relevant to the invention. Reference characters denote like elements throughout the figures and text.

DETAILED DESCRIPTION OF THE INVENTION

Figure 1A:
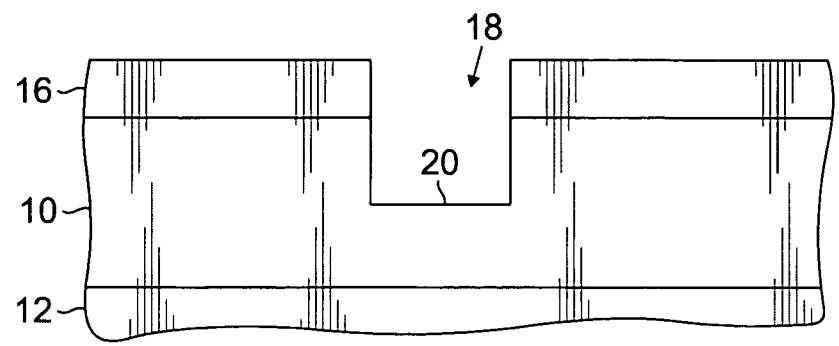
FIGS. 1A-1C and 2A-2C illustrate, in a cross-sectional views taken along a common plane, a prior art dual damascene structure.
Figure 1B:
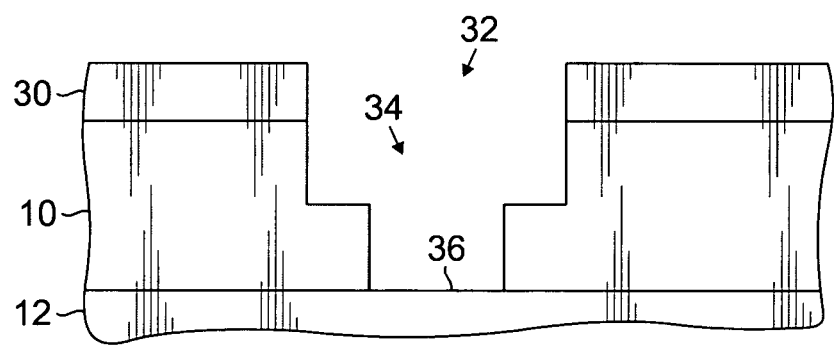
Figure 1C:
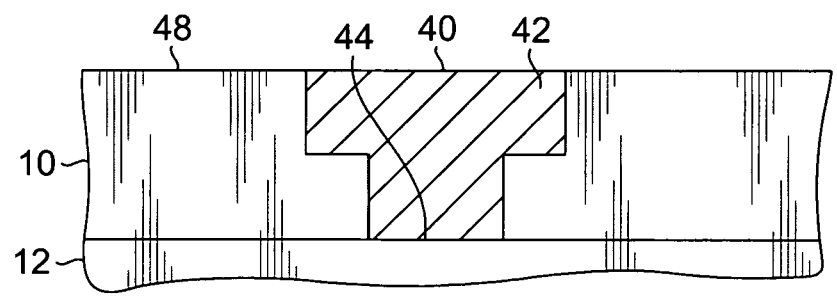
Figure 2A:
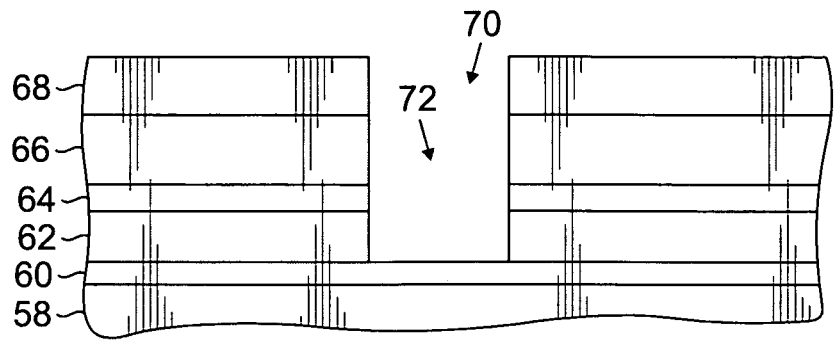
Figure 2B:
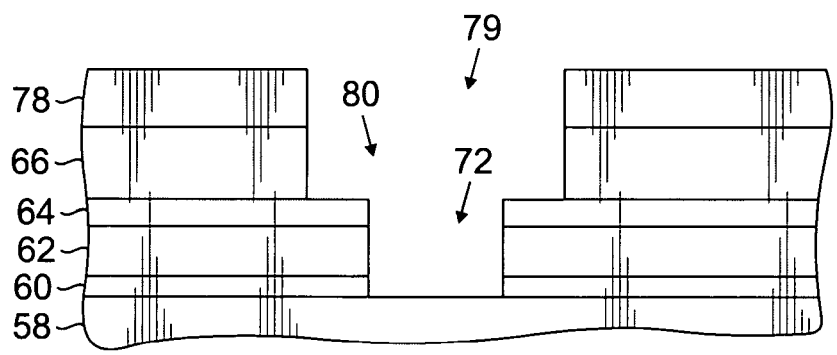
Figure 2C:
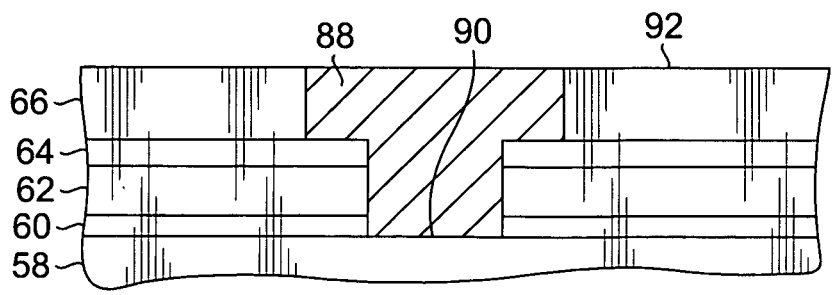

Before describing in detail the particular aluminum pad power bus or signal routing technology for integrated circuit devices in accordance with the present invention, it should be observed that the present invention resides primarily in a novel and non-obvious combination of elements and method steps. Accordingly, these elements and steps have been represented by conventional elements and steps in the drawings, showing only those specific details that are pertinent to the present invention so as not to obscure the description with structural details that will be readily apparent to those skilled in the art having the benefit of the description herein.

After fabrication, the integrated circuit is attached to a package structure that includes a chip attach region and a plurality of externally-disposed package leads through which the integrated circuit is connected to external components. Since the package leads cannot be connected directly to the thin fragile interconnect structures, the chip's final or upper metallization layer, referred to as an aluminum pad layer or a bond pad layer, comprises a plurality of bond or contact pads for connection to the package leads via a conductive lead or wire (typically formed from gold or its alloys) connected between a bond pad and an interior disposed contact of the package lead.

The bond pads are formed by depositing a metal barrier layer, typically tantalum-nitride, tantalum or titanium nitride, followed by an aluminum layer on an upper surface of the integrated circuit. The aluminum layer undergoes conventional masking, patterning, and etching steps to define the aluminum bond pads. In one embodiment, an antireflective coating layer is disposed over the aluminum layer to reduce aluminum reflections during the photolithographic process. A material of the antireflective coating layer comprises titanium-nitride or silicon oxynitride. The bond pads are connected to one or more underlying interconnect structures or circuit elements through underlying conductive vias. For those devices in which the interconnect structures are formed from copper, such as by the damascene process described above, the bond pads are conventionally formed of aluminum, as it is known that the gold wires adhere poorly to a copper bond pad.

Figure 3:
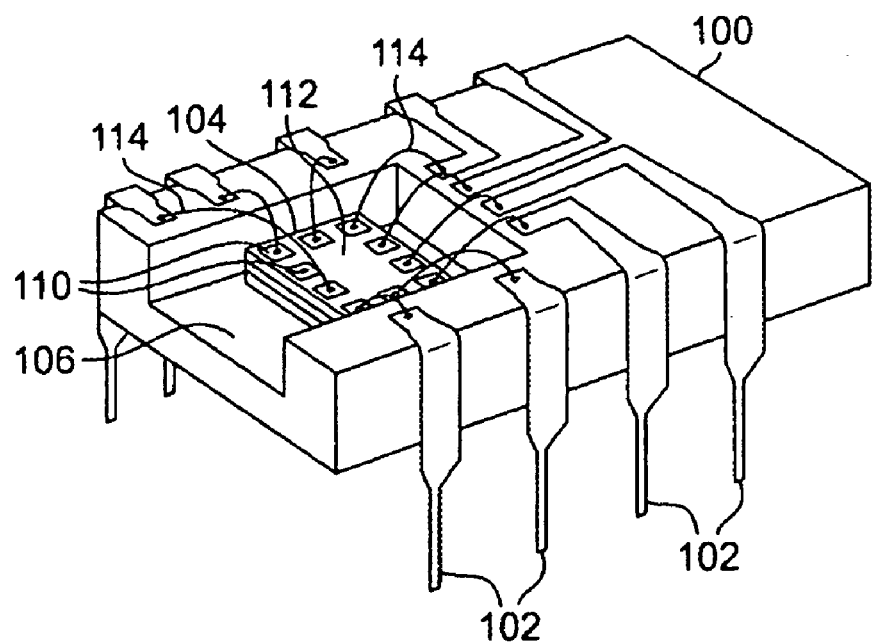
FIG. 3 is a perspective cut-away view of a package for an integrated circuit device constructed according to the teachings of the present invention.

FIG. 3 illustrates a device package 100 comprising package leads 102. An integrated circuit 104 is affixed within a die attach area 106. Bond pads 110 are formed on an upper surface 112 of the integrated circuit 104, and connected to the package leads 102 by gold wires 114. Generally, the bond pads 110 vary between about 40-80 microns and 50-150 microns in length and width, respectively. Although square bond pads are common, use of rectangular bond pads is also known in the prior art.

Figure 4A:
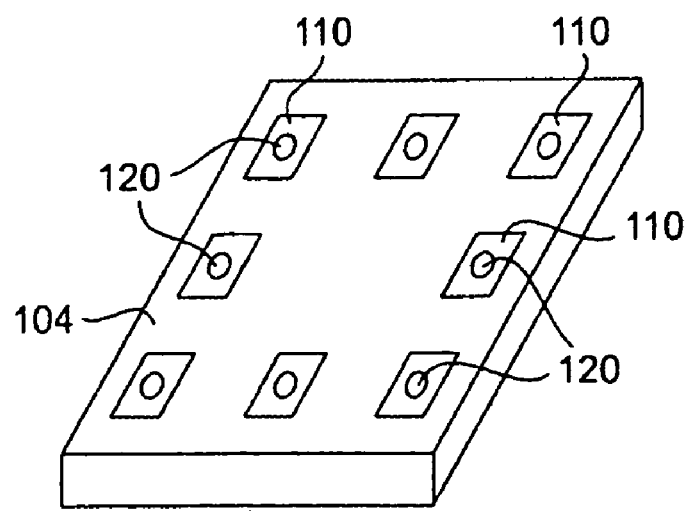
FIGS. 4A and 4B illustrate prior art flip-chip integrated circuit device structures.
Figure 4B:
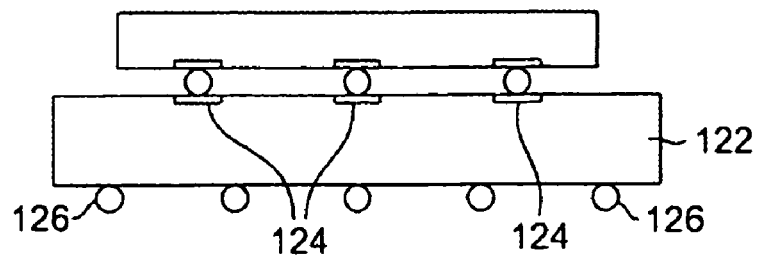

In another known package structure, referred to as flip-chip or bump bonding, the bond wires 114 of FIG. 3 are replaced with deposited solder bumps 120 formed on the bond pads 110. See FIG. 4A. Connection to a package 122 of FIG. 4B is accomplished by flipping the integrated circuit 104 and soldering the bumps 120 to receiving pads 124 on the package 122, that in turn connect to a corresponding package lead. In the example of FIG. 4B the package leads comprise a ball 126 in the form of a ball grid array, as is known in the art.

The metallization layer in which the bond pads 110 are formed is required whether the package leads 102 are connected to the integrated circuit 104 by bond wires 114 or solder bumps 120. According to the teachings of the present invention, the aluminum pad layer comprises both bond or contact pads and power bus or signal routing interconnect structures through which power is distributed to the elements of the integrated circuit device or through which signals are routed in the integrated circuit. Since the aluminum pad layer is always required to form the bond pads 110, no additional process steps, mask steps or metallization levels are added to the fabrication process by the present invention. To the contrary, one metallization level may be deleted. The invention is particularly suitable for use with copper technologies (i.e., damascene interconnect structures) since dual passivation stacks are conventionally formed over the copper interconnect structures prior to deposition of the aluminum for the bond pads. Thus the first dual passivation stack forms an effective insulating dielectric between the underlying top level interconnect structures and the overlying power bus formed in the aluminum pad layer.

Figure 5:
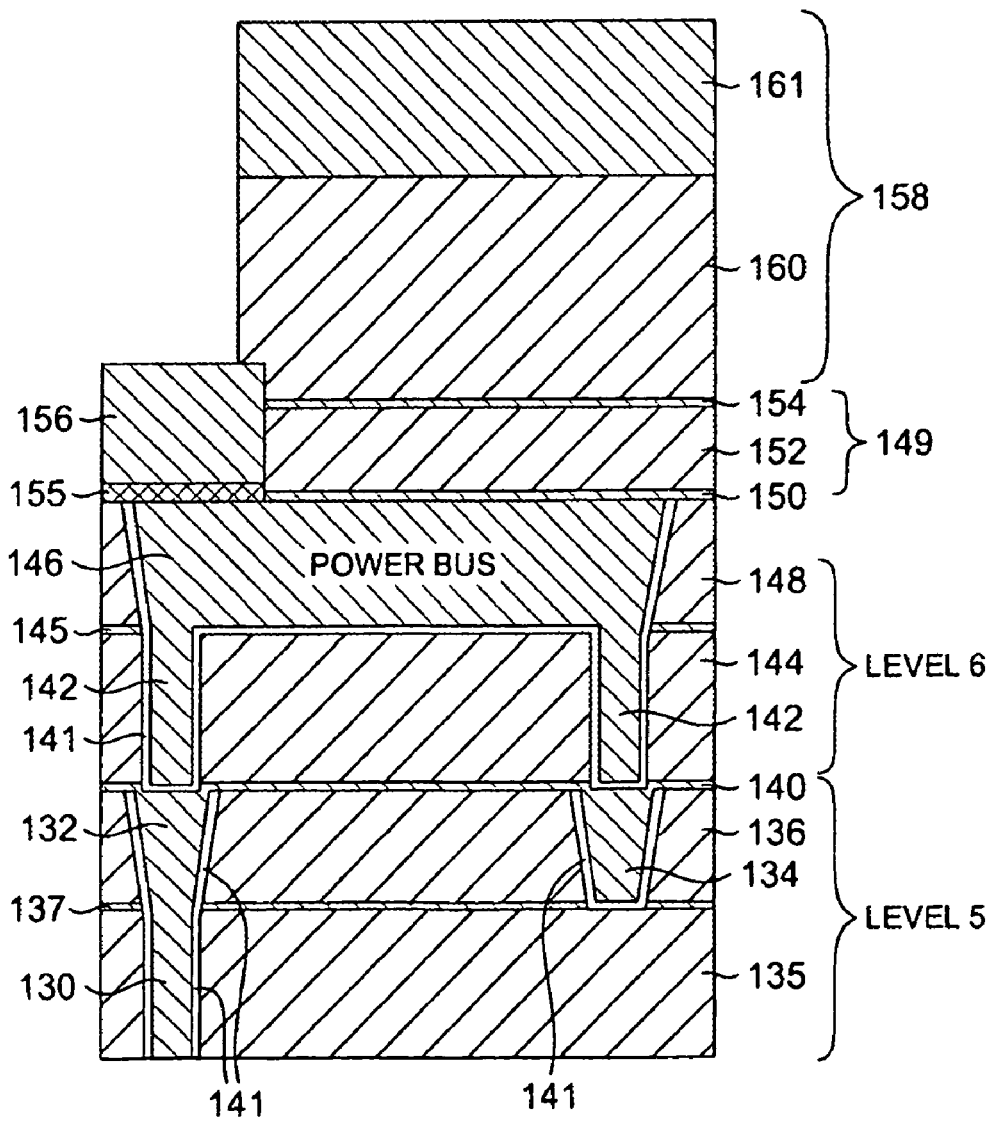
FIG. 5 illustrates, in a cross-sectional view taken along a common plane, a prior art interconnect structure including a power bus.

FIG. 5 illustrates a cross-sectional view of a conventional prior art interconnect metallization structure for an integrated circuit device, showing only the upper metallization levels 5 and 6 of a six level metal interconnect structure. In this example the interconnect structure comprises a copper dual damascene interconnect structure. Those skilled in the art recognize that the teachings of the present invention can be applied to integrated circuit devices having other than six levels or interconnect structures.

According to the dual damascene process, a level 5 conductive via 130 and level 5 conductive runners 132 and 134 are simultaneously formed within a via opening and trenches previously formed in dielectric layers 135 and 136, respectively. The conductive via 130 and level 5 conductive runners 132 and 134 can be separated by an etch stop layer 137 that facilitates separate formation of the via opening and the trenches according to conventional dual damascene processing. However, the etch stop layer 137 is not required for functionality of the dual damascene elements. The conductive via 130 is connected to an underlying interconnect structure or circuit element not shown in FIG. 5. A dielectric barrier layer 140 (exemplary materials include silicon nitride, silicon carbide or combinations thereof) overlies the dielectric layer 136 and the exposed upper surface of the level 5 conductive runners 132 and 134. The dielectric barrier layer 140 acts as an etch stop for fabrication of the next-level conductive via and serves as a diffusion barrier to prevent surface interdiffusion of copper from the conductive runners 132 and 134 into the dielectric layer 136. An additional barrier layer 141 surrounds the various copper features to prevent lateral copper diffusion into the dielectric material.

Level 6 conductive vias 142, formed in a dielectric layer 144, are in electrical contact with the underlying level 5 conductive runners 132 and 134. A dielectric barrier layer 145, serving the same purpose as the dielectric barrier layer 140, overlies the dielectric layer 144. A power bus 146 is formed in an oxide layer 148 overlying the dielectric layer 144. According to the dual damascene process described above, the conductive vias 142 and the power bus 146 are formed simultaneously in previously formed via openings and trenches. Note the larger cross-sectional area required for the power bus 146 compared with the level 5 conductive runners 132 and 134. This is preferred as the power bus 146 carries higher currents than the low-current signals carried by the conductive runners 132 and 134.

A first passivation stack 149, comprising a silicon nitride layer 150, an oxide layer 152 and a silicon nitride layer 154 is formed overlying the power bus 146. The first passivation stack 149 forms the first layer of the dual passivation scheme referred to above. Openings are defined in the first passivation stack 149 by conventional lithographic and plasma etching processes to expose the underlying copper of the power bus 146. A conductive barrier layer 155, comprising, for example, tantalum, titanium nitride or tantalum nitride, is formed over regions of the power bus 146 exposed through the openings in the first passivation stack 149. The conductive barrier layer 155 prevents the intermixing of copper from the power bus 146 and aluminum from the aluminum pads. An aluminum layer (more conventionally an aluminum-copper alloy) is blanket deposited over the barrier layer 155, then masked, patterned and etched to form an aluminum pad 156 within the opening and further in contact with the underlying power bus 146 through the conductive barrier layer 155.

After formation of the aluminum pad 156, the integrated circuit device is again passivated by a second passivation stack 158, comprising an oxide layer 160 and an overlying silicon nitride layer 161.

As described above, the aluminum pads serve as connection points between the underlying copper interconnect structures and the bonds wires 114 of FIG. 3 or the metal bumps 120 of FIG. 4. It is also known in the art that additional under-bond or under-ball/bump metallurgy layers and/or materials may be required above and/or below the aluminum pad 156 to ensure adequate adhesion with the gold bond wire or the solder ball. When the assembly is complete and the packaged chip is inserted into an operative circuit, the aluminum pad 156 carries power to the elements of the integrated circuit device through the power bus 146.

The thickness of the various layers illustrated in FIG. 5 (which is not to scale) is conventional in the art, and the techniques for forming the various material layers are also well known.

As FIG. 5 illustrates only a region of the interconnect structure, at other locations of the integrated circuit device (not shown), aluminum pads similar to the aluminum pad 156 are connected to underlying conductive runners or conductive vias for carrying signals from the package leads to the underlying structure or for supplying signals from the underlying structure to the package leads.

Figure 6:
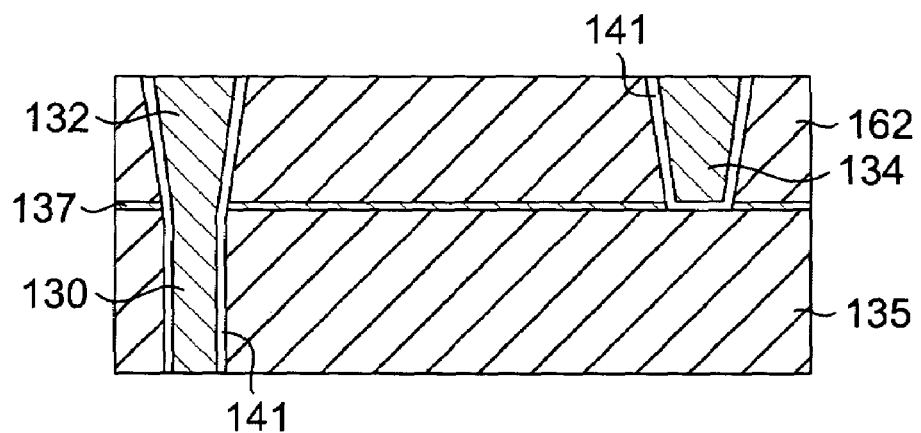
FIGS. 6-11 are cross-sectional views taken along a common plane, illustrating sequential processing steps in the fabrication of an interconnect structure, including a power bus, according to the teachings of the present invention.

FIG. 6, showing only the uppermost interconnect level of a damascene interconnect structure, begins a series of cross-sectional views depicting the process steps for forming an interconnect metallization structure for an integrated circuit device according to the teachings of the present invention. The conductive via 130 is formed in the dielectric layer 135 and connected to an underlying interconnect structure or circuit element not shown in FIG. 6. Conductive runners 132 and 134 are formed in a dielectric layer 162. In one embodiment the dielectric layer 162 comprises silicon dioxide. The material of the various dielectric layers shown in FIGS. 6-11 can comprise any of the following, and other suitable materials known in the art: fluro-silicate glass (FSG), oxides, fluorine-doped TEOS, (tetraethyl orthosilicate), low dielectric constant materials, and organo-silicate glass (OSG). Also, the material of the various barrier layers shown and described can comprise silicon carbide, silicon nitride, phosphorous-doped oxide and other materials known in the art.

Figure 7:
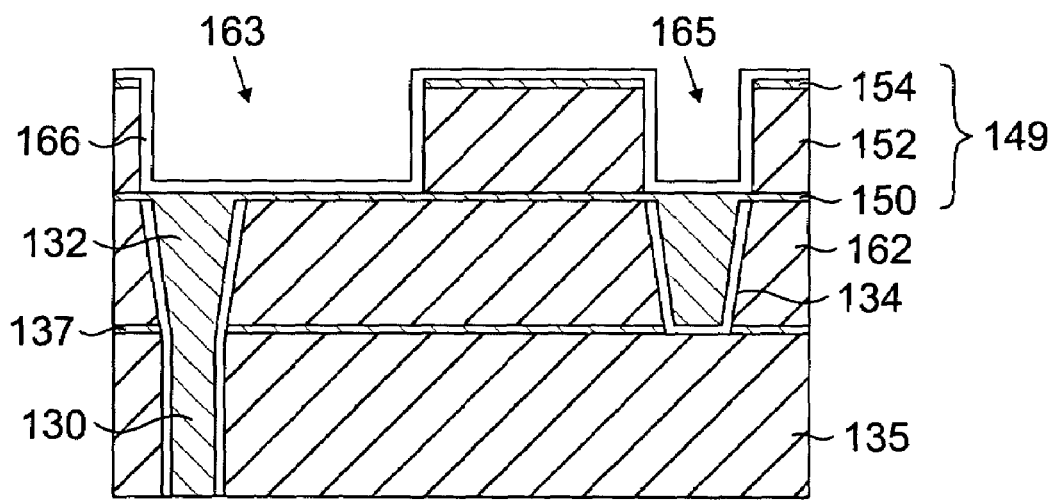

As shown in FIG. 7, the first passivation stack 149 (comprising the silicon nitride layer 150, the oxide layer 152 and the silicon nitride layer 154) is formed overlying the conductive runners 132 and 134 and the dielectric layer 162. Openings 163 and 165 are defined and formed by conventional lithographic and dielectric etching techniques through the first passivation stack 149.

A conductive barrier layer 166 is formed over the exposed surface. The barrier layer 166, which typically comprises tantalum-nitride, serves as a glue layer between the underlying material and the aluminum to be formed thereover. The tantalum-nitride also reduces the known electromigration effects encountered in aluminum interconnect structures and provides a diffusion barrier between the overlying aluminum and the underlying copper.

Figure 8:
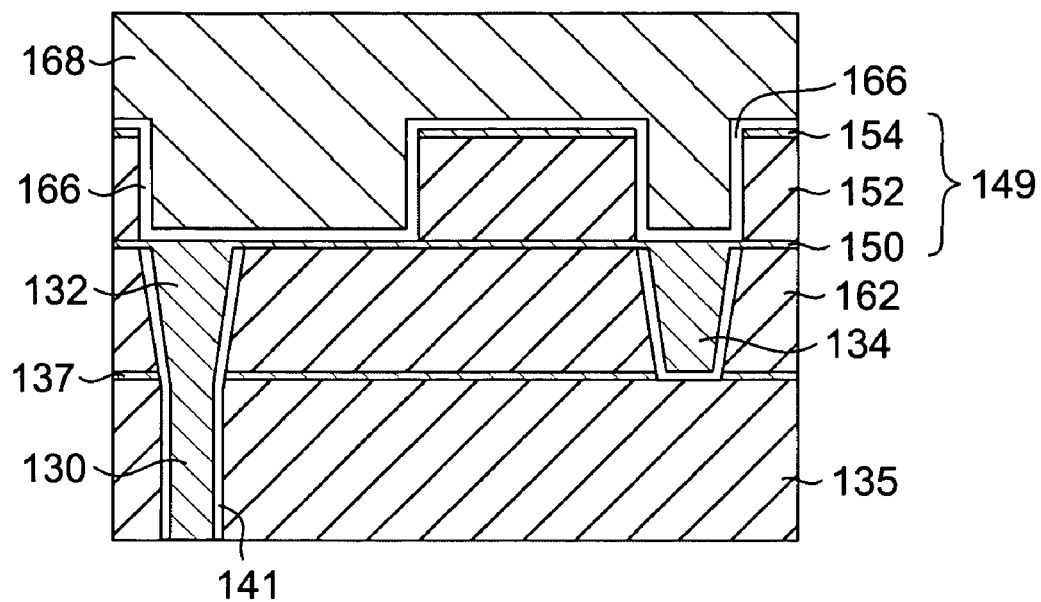
Figure 9:
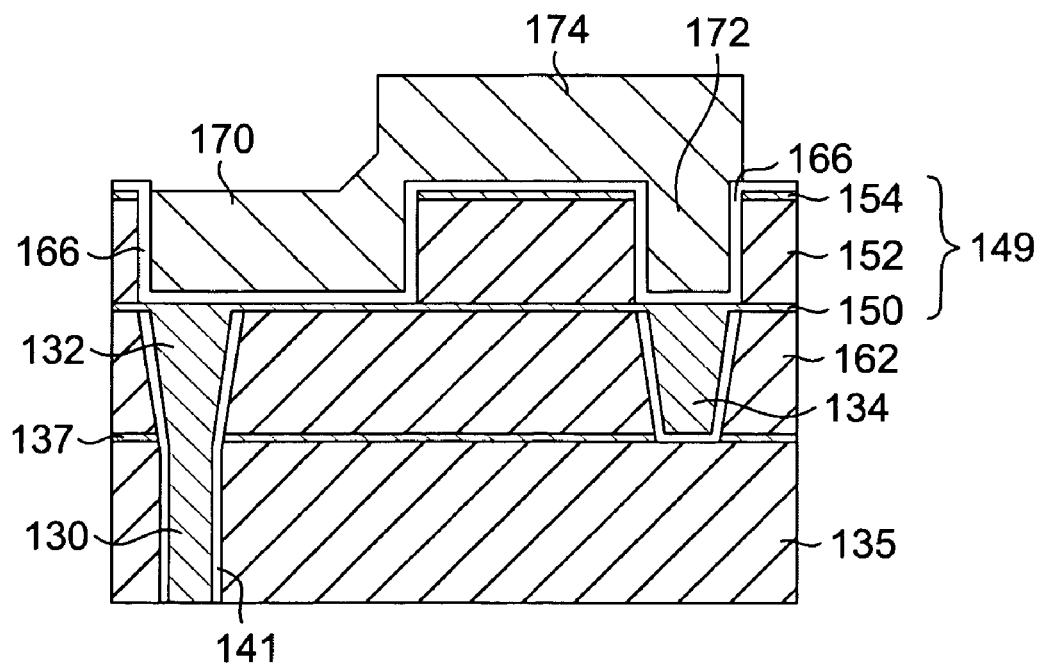

An aluminum-copper alloy layer 168 (or in certain embodiments, an aluminum-silicon-copper alloy) is blanket deposited as shown in FIG. 8, filling the openings 163 and 165. An aluminum pad 170 is formed within the opening 163 by patterning, masking and etching steps performed on the aluminum layer 168. See FIG. 9. A conductive via 172 is formed in the opening 165 in conductive contact with the runner 134.

The same masking, patterning and etching steps employed to form the aluminum pad 170 also form a power bus 174 in the aluminum layer 168. Also, during the step of forming the power bus 174, signal routing interconnects are formed in the aluminum-copper alloy layer 168. The signal interconnects are not shown in FIG. 9 as they are located in other regions of the substrate not illustrated in FIG. 9.

Figure 10:
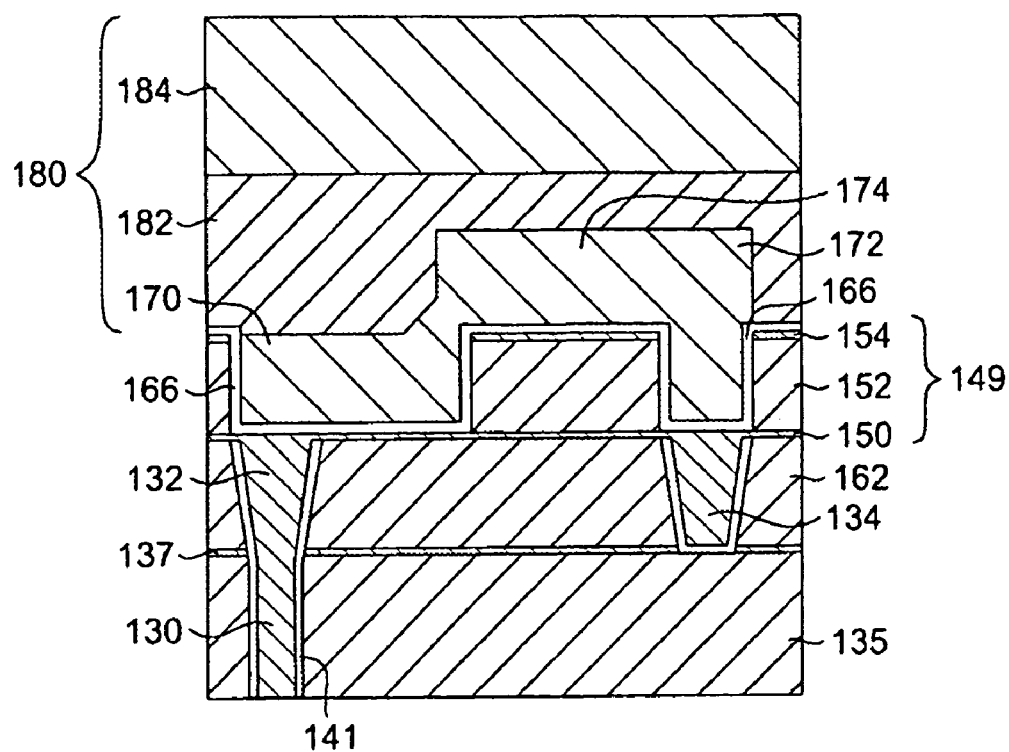
Figure 11:
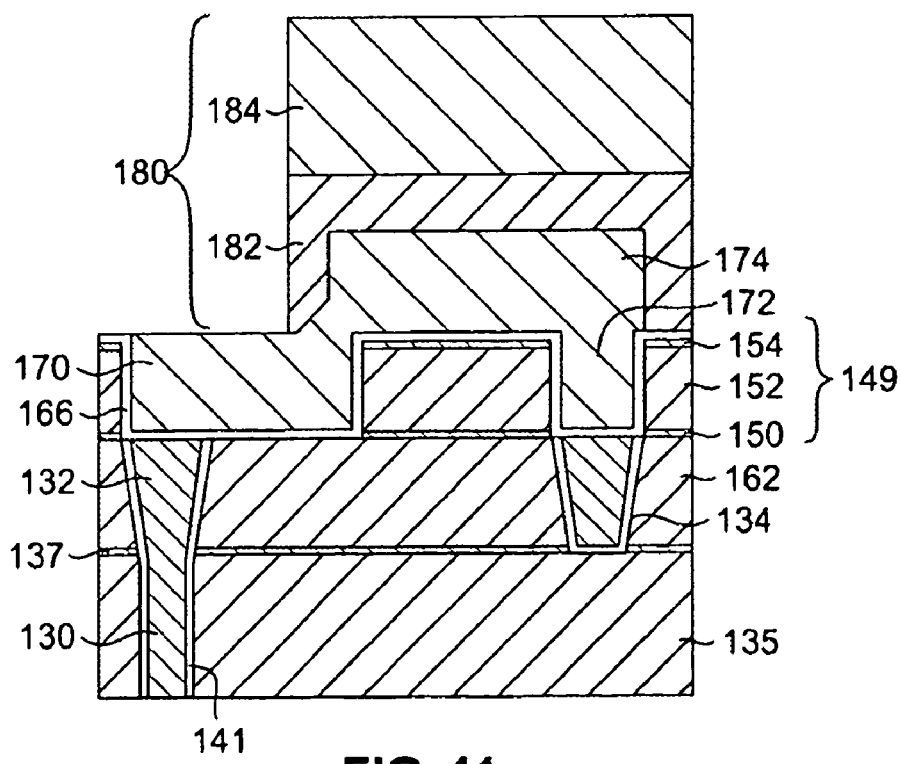

An overlying passivation stack 180 comprises an oxide layer 182 and a silicon nitride layer 184 formed as illustrated in FIG. 10. Openings are formed by known techniques in the passivation stack 180 to access the aluminum pad 170 (and other opening not shown in FIG. 10 or 11 are formed to access the signal routing interconnects). See FIG. 11 for the final structure. The integrated circuit device is now ready for attachment to a package and wire bonding or bump bonding of the aluminum pad 170 to the package leads.

The formation of the power bus 174 in the aluminum pad layer as taught by the present invention eliminates one metallization layer (i.e., a copper layer when the teachings of the present invention are applied to a copper damascene process) and the attendant process steps and mask requirements. The prior art embodiment of FIG. 5 includes a metallization layer, i.e., comprising the conductive vias 142, that is absent in the structure according to the present invention as shown in FIG. 11.

Current integrated circuits are fabricated with aluminum pads having a thickness of about 1 micron or greater. This thickness is sufficient for carrying the power current and thus formation of the power bus 174 in the aluminum pad layer is feasible and easily adapted to present fabrication process steps. The mask created for patterning the aluminum pads according to the prior art can be modified to include patterns for the power bus interconnect structures at little extra expense.

Figure 12:
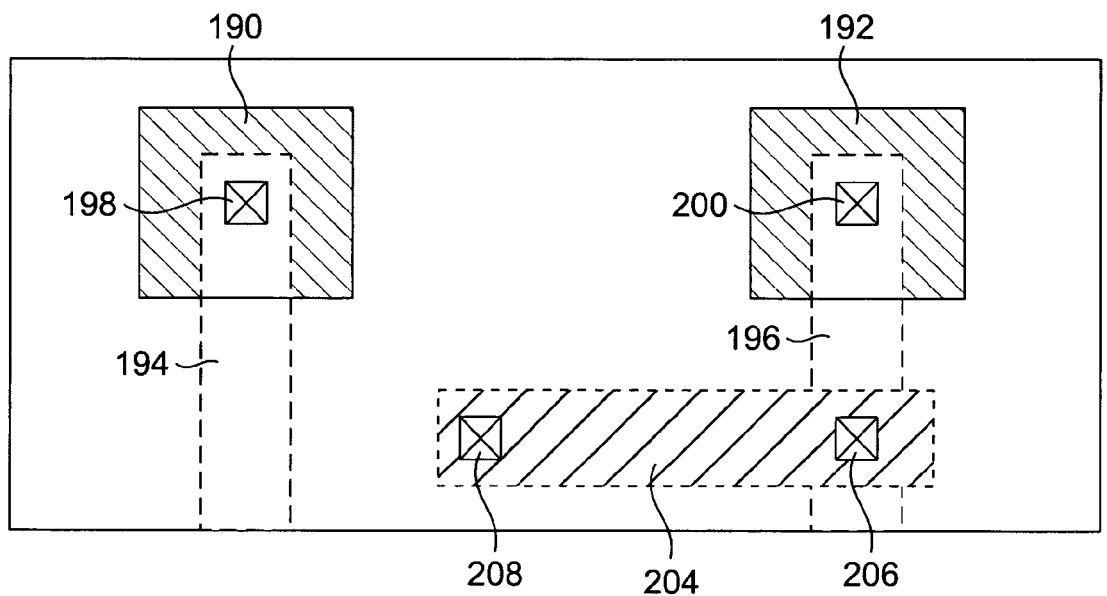
FIG. 12 is a top view of a prior art interconnect structure for an integrated circuit device.

FIG. 12 is an exemplary top view of a region of a prior art integrated circuit illustrating certain interconnect structures on and below a surface of the region. Aluminum pads 190 and 192 are connected to underlying (i.e., one level below) metallization level conductive runners 194 and 196 through vertical conductive vias 198 and 200, respectively. The conductive runners 194 and 196 can represent the power bus 146 in FIG. 5. A conductive runner 204 disposed in an interconnect level below the conductive runners 194 and 196 (representative of the conductive runners 132 and 134 of FIG. 5) is connected to the conductive runner 196 through a conductive via 206, and further connected to additional underlying interconnect structures and elements through a conductive via 208.

Figure 13:
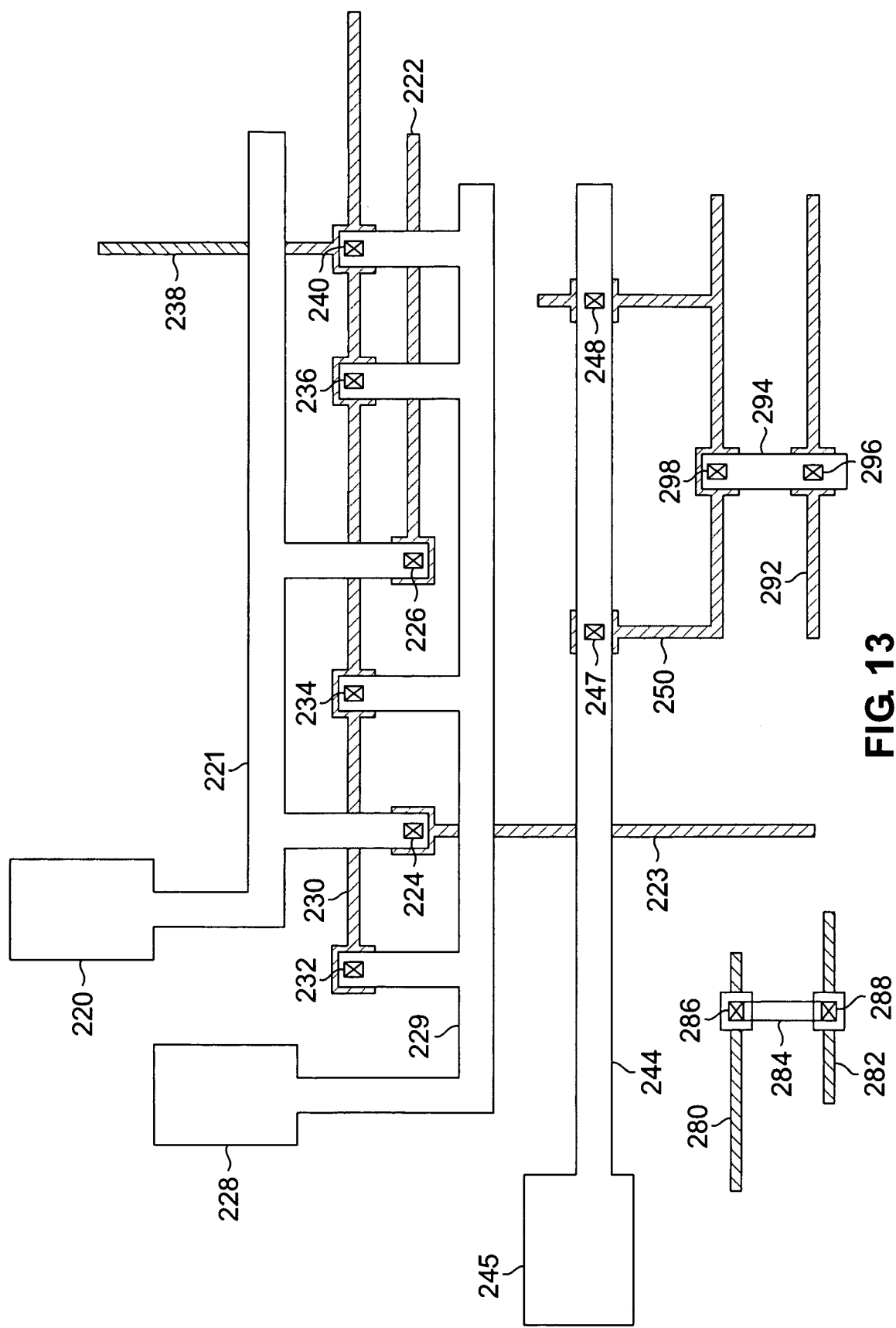
FIG. 13 is a top view of an interconnect structure constructed according to the teachings of the present invention.

FIG. 13 is an exemplary top view of a region of an integrated circuit device illustrating certain interconnect structures on and below the surface of a device as constructed according to the teachings of the present invention. The teachings of the present invention, as can be appreciated by those skilled in the art, can be applied to an integrated circuit device structure having any number of metal interconnect layers, where "n" represents the top metallization level and the underlying levels are referred to with reference to the $n^{th}$ level., e.g., the n-1 or the n-2 level.

An aluminum pad 220 forms an integral part of a power bus 221 (formed in metallization level "n," i.e., the uppermost level) for connection to underlying n1 level conductive runners 222 and 223 through vertical conductive vias 226 and 224. When the aluminum pad 220 is connected to a power source, via the package leads as described above, the power bus 221 (which can be representative of the power bus 174 in FIG. 6) transfers or distributes power to the conductive runners 222 and 223, that in turn connect to underlying conductive runners (not shown in FIG. 13) for continued distribution of power throughout the integrated circuit. Although the power bus 221 is illustrated as connected only to the n1 metallization level, this is solely for exemplary purposes, as connection to lower metallization levels can be made through a succession of vertical conductive vias.

Continuing with FIG. 13, an aluminum pad 228 forms an integral part of an interconnect structure 229, that is in turn connected to an underlying n-1 level conductive runner 230 through vertical conductive vias 232, 234 and 236. The n-1 level conductive runner 230 is further connected to an n-2 level conductive runner 238 through a conductive via 240. In one example, the aluminum pad 228 can receive signals external to the integrated circuit via the package leads, and supply the signals to the appropriate device elements through the various interconnect structures connected to the aluminum pad 228.

An n-level conductive runner 244 forms an integral part of an aluminum pad 245 and is connected to conductive vias 247 and 248, that are further connected to an underlying conductive runner 250 (in an n-i level, where i=1 to n-1).

According to a second embodiment of the present invention, the aluminum pad layer provides interconnect structures for underlying copper layers, wherein the interconnect structures are not connected to a pad. For example, as further illustrated in the device top view of FIG. 13, conductive runners 280 and 282 (for example, both disposed in the n-1 level) are connected with an interconnect structure 284 (formed in the aluminum pad layer n), through conductive vias 286 and 288. In another example, the conductive runner 250 and a conductive runner 292 (for example, both disposed in the n-1 level) are connected by an interconnect structure 294 formed in the aluminum pad layer (n), through conductive vias 298 and 296. Thus in addition to providing the power bus interconnect structure as described above, interconnect structures (such as the interconnect structure 274) for underlying copper layers can also be formed in the aluminum pad layer. As a result, an underlying interconnect layer can be eliminated by using the aluminum pad layer to provide an interconnect function.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit device comprising:
   a metallization interconnect system overlying a semiconductor substrate, the metallization interconnect system including at least a first and a second interconnect feature located within a dielectric layer;
   a power bus located over the metallization interconnect system, the power bus comprising an alloy of aluminum and copper, and further wherein the power bus includes a first contact pad region configured for connection external to the integrated circuit device that is in contact with the first interconnect feature, and a second region in contact with the second interconnect feature; and
   a passivation layer overlying at least a portion of the power bus to expose at least a portion of the first contact pad region and protect the second region.

2. The integrated circuit device of claim 1 wherein a plane of an upper surface of the first contact pad region is not coplanar with a plane of an upper surface of the second region.

3. The integrated circuit device of claim 2 wherein the plane of the second region is above the plane of the first contact pad region.

4. The integrated circuit device of claim 1 wherein the first contact pad region is configured for connection external to the device by a bond wire attached directly thereto.

5. The integrated circuit device of claim 1 wherein first contact pad region is configured for connection external to the device by a solder bump attached directly thereto.

6. The integrated circuit device of claim 1 wherein the metallization interconnect system comprises copper, and further including a barrier material located between the metallization interconnect system and the power bus in regions where the first contact pad region contacts the first interconnect feature and the second region contacts the second interconnect feature.

7. The integrated circuit device of claim 1 wherein the metallization interconnect system further comprises substantially horizontal conductive runners and substantially vertical conductive vias interconnecting overlying and underlying conductive runners.

* * * * *